(12) United States Patent
Chou et al.

(10) Patent No.: US 7,913,215 B2
(45) Date of Patent: Mar. 22, 2011

(54) MEMORY MACRO WITH IRREGULAR EDGE CELLS

(75) Inventors: Chung-Cheng Chou, Hsin chu (TW); Cheng-Hung Lee, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 415 days.

(21) Appl. No.: 11/493,405

(22) Filed: Jul. 26, 2006

(65) Prior Publication Data

US 2008/0028351 A1 Jan. 31, 2008

(51) Int. Cl.
*G06F 17/50* (2006.01)
(52) U.S. Cl. ........................................ 716/118; 716/119
(58) Field of Classification Search .............. 716/10–14, 716/118, 119, 139; 365/200, 210, 230.03
See application file for complete search history.

(56) References Cited

U.S. PATENT DOCUMENTS

| | | | | |
|---|---|---|---|---|
| 6,411,556 | B1 * | 6/2002 | Amano | 365/200 |
| 6,519,746 | B1 * | 2/2003 | Andreev et al. | 716/6 |
| 7,313,769 | B1 * | 12/2007 | Lukanc et al. | 716/2 |
| 7,404,154 | B1 * | 7/2008 | Venkatraman et al. | 716/2 |
| 2002/0053691 | A1 * | 5/2002 | Leung et al. | 257/296 |

\* cited by examiner

*Primary Examiner* — Jack Chiang
*Assistant Examiner* — Binh C Tat
(74) *Attorney, Agent, or Firm* — K&L Gates LLP

(57) ABSTRACT

A memory macro includes a first set of cells disposed in a first area of a memory array, and a second set of cells, which differ from the first set of cells in physical dimensions, disposed at an edge of the first area for improving robustness of the cells at the edge of the memory array.

20 Claims, 6 Drawing Sheets

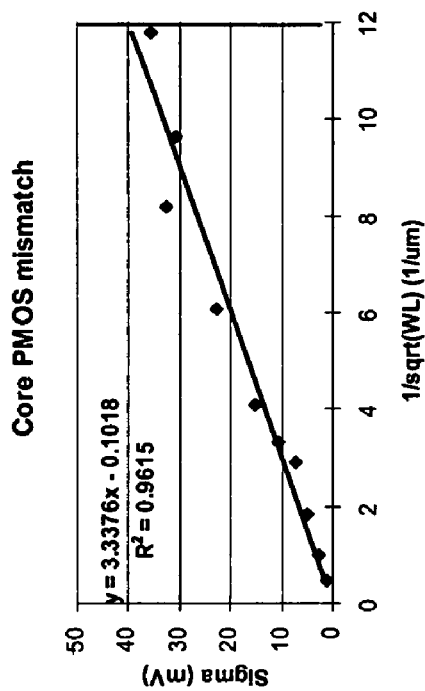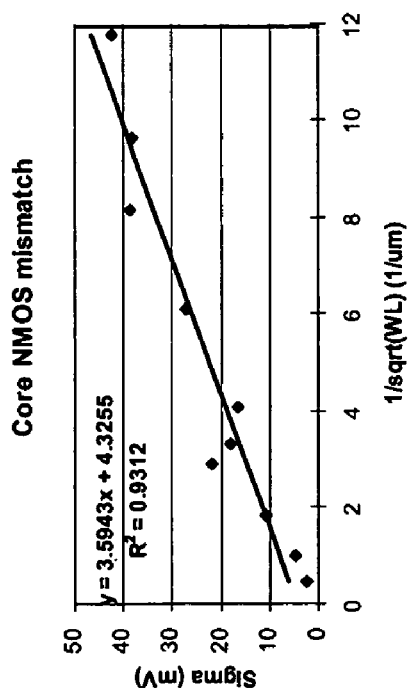
FIG. 5

MEMORY MACRO WITH IRREGULAR EDGE CELLS

BACKGROUND

The present invention relates generally to integrated circuit (IC) designs, and more particularly to a memory macro with irregular edge cells.

The rapid growth in complexity of modern electronic circuits has forced electronic circuit designers to rely upon computer programs to assist or automate most steps of the design process. A typical circuit design contains hundreds of thousands or millions of individual pieces or "leaf cells" or "cells." Such design is too large for a circuit designer or even a team of designers to manage manually. Thus, a memory compiler is often used to facilitate memory designs. A typical memory compiler is a set of various, parameterized generators that can help designers to lay out memory macros, such as dynamic random access memory (DRAM) macros or static random access memory (SRAM) macros.

Conventionally, all cells in a memory layout are identical. However, in a typical memory device, the cells at edges of a memory array often have weaker electrical characteristics than their inner counterparts. One of the reasons causing the weaker edge cells is the loading effect, which refers to a phenomenon where the etch rate across a semiconductor wafer varies, as the pattern density varies over the surface of the wafer. These edge cells can have a smaller storage capacitance and driving current than those of the inner cells. In some cases, these weaker edge cells can adversely affect the yield rate of the memory devices.

As such, what is needed is a memory device with modified edge cells in order to improve its performance and overall yield rate.

SUMMARY

The present invention discloses a memory macro with irregular edge cells. In one embodiment of the present invention, the memory macro includes a first set of cells disposed in a first area of a memory array, and a second set of cells, which differ from the first set of cells in physical dimensions, disposed at an edge of the first area for improving robustness of the cells at the edge of the memory array.

The construction and method of operation of the invention, however, together with additional objectives and advantages thereof will be best understood from the following description of specific embodiments when read in connection with the accompanying drawings.

BRIEF DESCRIPTION OF THE DRAWINGS

FIG. 5 graphically illustrates the relation between the sense amplifier size and the sensing margin.

DESCRIPTION

Figure 1:
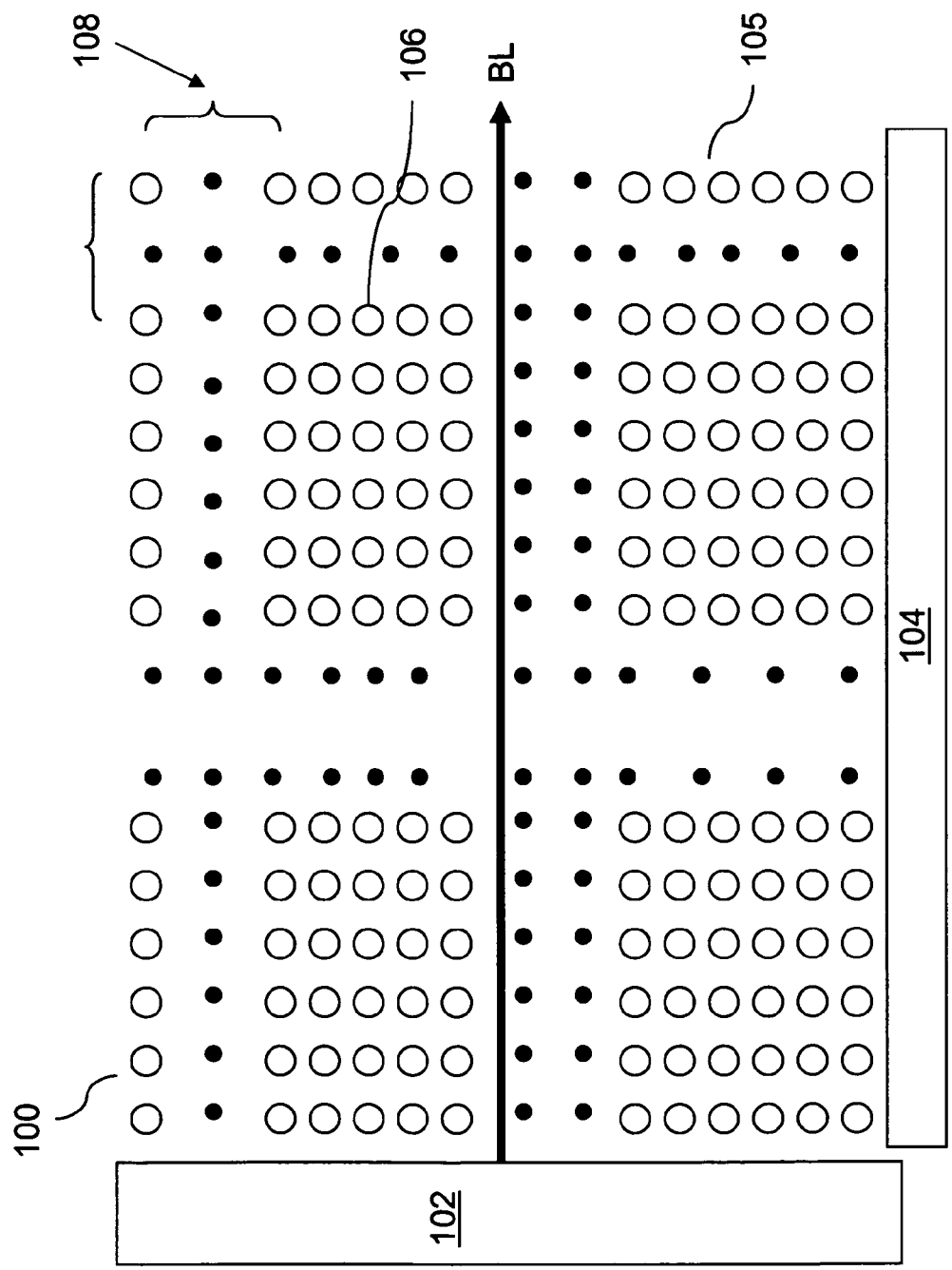
FIG. 1 partially illustrates a conventional memory macro.

FIG. 1 partially illustrates a conventional memory macro 100, which includes a memory array 105 with memory cells at intersections of rows and columns. A first set of memory cells 106 (hereinafter also referred to as "the inner cells") are disposed at an inner area of the memory array 105. A second set of memory cells 108 (hereinafter also referred to as "the edge cells") are located at one or more edges of the memory array 105. The column decoder and sense amplifier 102 and the row decoder 104 are located at the end of columns and rows for selecting a memory cell for a read, write or erase operation.

In a design stage, all the memory cells, including the inner and edge cells 106 and 108, are identical to one another. However, the dimensions of the edge cells 108 and the inner cells 106 may become different after the memory device 100 goes through various processing steps. For example, the loading effect may change the dimensions of the edge cells 108. The changed dimensions make the edge memory cells 108 function differently from the inner memory cells 106. For example, in a dynamic random access memory (DRAM) device, the edge cells may have lower capacitance than those of the inner cells. For another example, in a static random access memory (SRAM) device, the edge cells may produce less driving current than the inner cells. The weaker edge cells may, in turn, reduce the yield rate for the memory devices.

Figure 2:
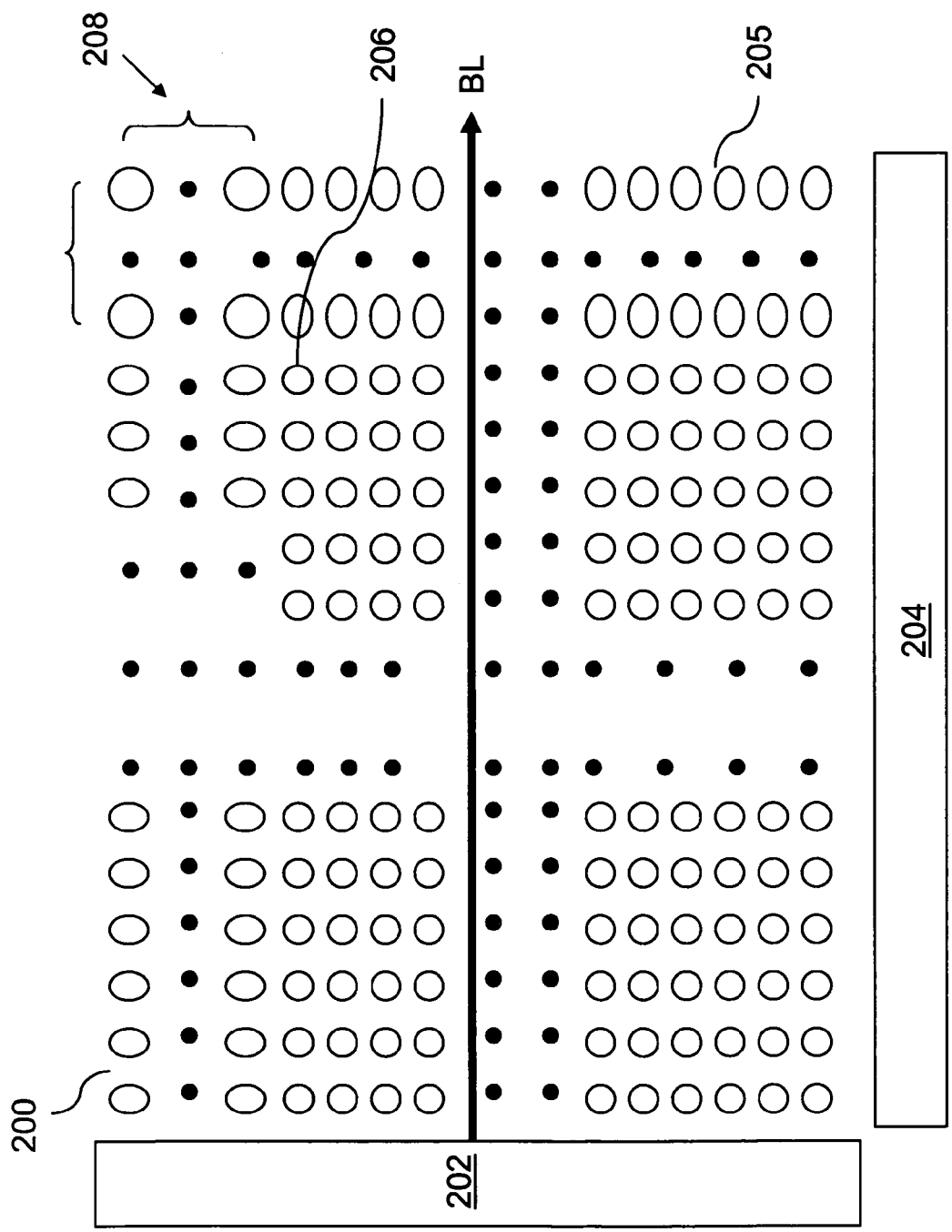
FIG. 2 partially illustrates a memory macro in accordance with one embodiment of the present invention.

FIG. 2 partially illustrates a memory macro 200 in accordance with one embodiment of the present invention. The memory macro 200 includes a memory array 205 with memory cells at intersections of rows and columns. The memory macro 200 can be a SRAM, DRAM, non-volatile memory or magnetoresistive random access memory (MRAM). A first set of memory cells 206 (hereinafter also referred to as "the inner cells") are disposed at an inner area of the memory array 205. A second set of memory cells 208 (hereinafter also referred to as "the edge cells") are located at one or more edges of the memory array 205. The column decoder and sense amplifier 202 and the row decoder 204 are located at the end of columns and rows for selecting a memory cell for a read, write or erase operation.

The proposed embodiment of the present invention allows the memory macro 200 to better sustain process variations, such as the loading effect caused by semiconductor processing technology, such as plasma etching or chemical mechanical polishing, during its fabrication stage. The inner memory cells 206 are designed to be regular cells, meaning that they have identical physical dimensions, construction rules and operation conditions. The edge memory cells 208 are designed to be irregular cells, meaning that they differ from the inner memory cells 206 in physical dimensions, construction rules or operation conditions. The irregular edge cells 206 allow the pattern at the edge of the memory array 205 to be different from that at the inner area thereof. Thus, the etch rate at the edge can be adjusted by carefully designing the physical dimensions of the edge cells 208.

It is noted that while FIG. 2 shows one row and column of edge cells 208 are arranged at the top and right edges of the memory array 205, respectively, the number of the rows and columns of the edge cells 208 can vary. For example, it is within the spirit of the invention that either a row or a column of edges cells 208 is disposed as long as it satisfies design requirements. Likewise, two or more rows and columns of edge cells 208 can also be used as required by designers.

The edge cells 208 can be designed as operative or inoperative cells. The chip size will be reduced if the edge cells 208 are designed as operative. If the edge cells are operative, they would operate under one or more conditions, such as the well bias, well pick-up bias, and ground-node bias, which are independent from those for the inner cells 206. The edge cells 208 can be designed with loosened rules, such that the electronic components in the edge cell 208 would be stronger than those in the inner cell 206. For example, a channel length or width of a transistor in the edge cell 208 can be larger than that of a transistor in the inner cell 206 by 5%. For a memory device made by 90 nm semiconductor processing technology, a channel length or width of a transistor in the edge cell 208 can be larger than that of a transistor in the inner cell 206 by a range from 5% to 30%, to compensate variations induced by the manufacturing process. For a memory device made by 65 nm semiconductor processing technology, a channel length or width of a transistor in the edge cell 208 can be larger than that of a transistor in the inner cell 206 by a range from 15% to 60%, to compensate variations induced by the manufacturing process. The edge cell 208 can provide a larger storage node capacitance and a stronger driving current.

The edge cells 208 can be designed to be inoperative. There are several ways to make the edge cells 208 as inoperative dummy cells. One way is to deliberately make the edge cells 208 incomplete. For example, the edge cells 208 can be designed to omit at least one critical layer, such as an oxide defined (OD) layer and polysilicon layer, which is necessary for the same to be operative. For another example, the edge cells 208 can be designed to omit at least one critical electronic component, such as a pass gate transistor, pull-down device, and pull-up device, which is necessary for the same to be operative. Alternatively, the edge cells 208 can be constructed in the same way as other normal cells, but are disabled from carrying out their functions. In all cases, the irregular edge cells 208 strengthen the robustness at the edge of memory array 205.

Figure 3:
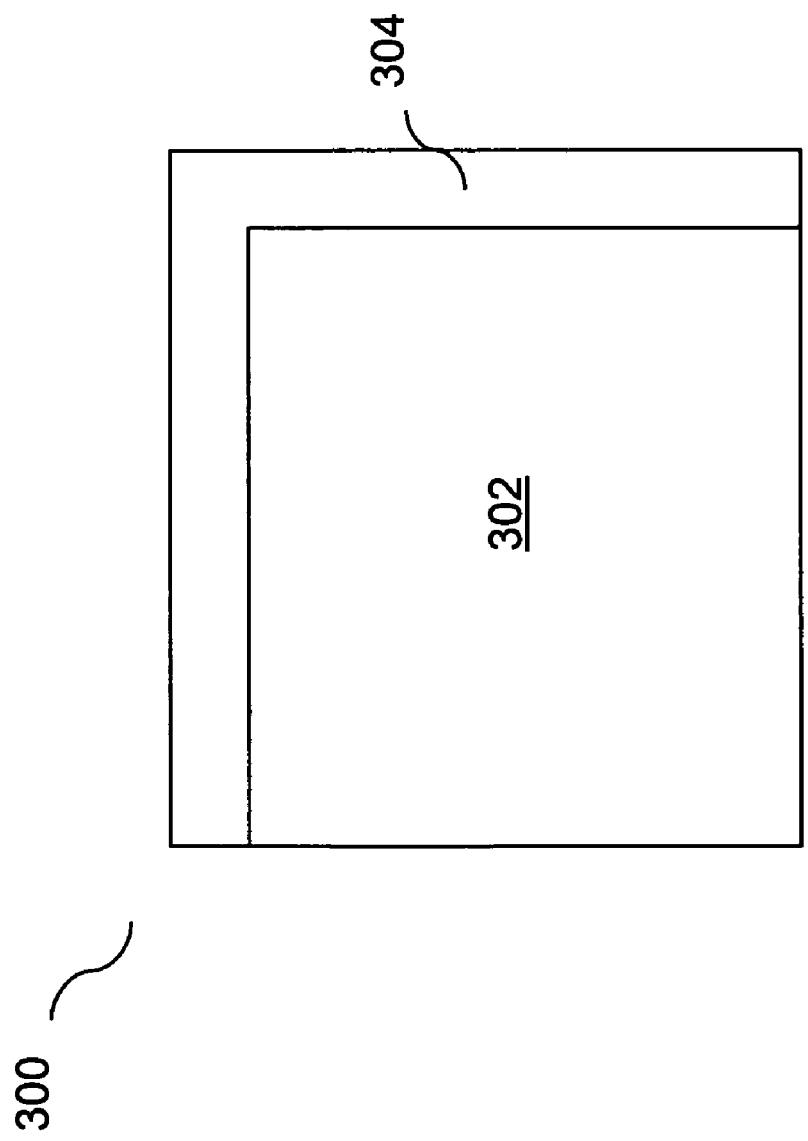
FIG. 3 illustrates a layout diagram for a memory macro in accordance with another embodiment of the present invention.

FIG. 3 illustrates a layout diagram for a memory macro 300 in accordance with another embodiment of the present invention. The layout diagram can be generated by using an automated tool, such as a memory compiler. The memory macro 300 includes a first area 302 and a second area 304 located at the edges thereof. The memory compiler can tile the first and second areas with regular and irregular cells, respectively. The irregular cells can be the operable or inoperable cells discussed above. As such, the memory macro made based on the layout diagram can better sustain the process variations and improve its performance.

Figure 4:
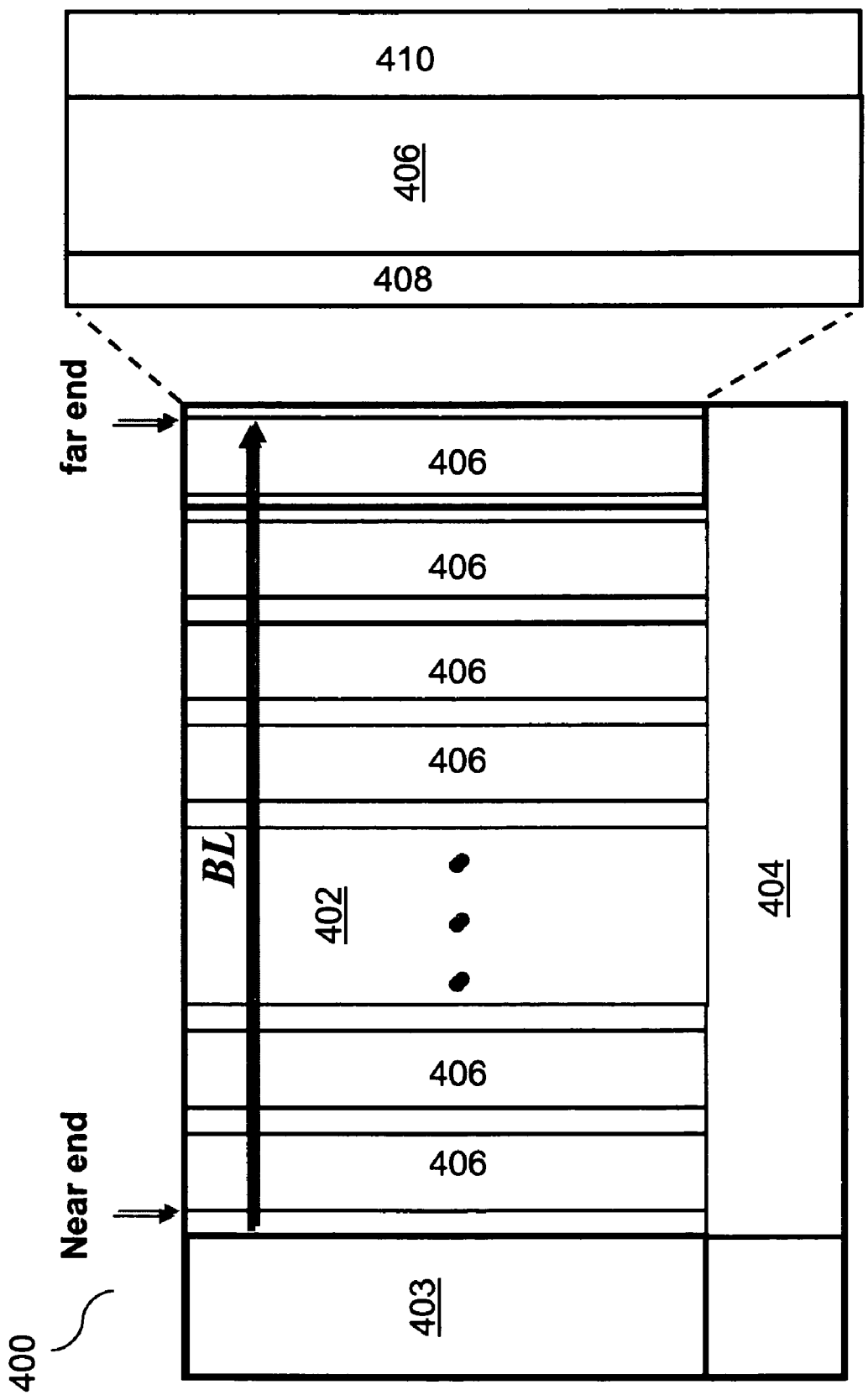
FIG. 4 illustrates a layout diagram for a memory macro in accordance with yet another embodiment of the present invention.

FIG. 4 illustrates a layout diagram for a DRAM macro 400 in accordance with yet another embodiment of the present invention. The DRAM macro 400 includes a memory array 402 with a plurality of sub-arrays having regular memory cells 406 and sense amplifiers 408, which is comprised of regular electronic components, adjacent to the regular memory cells. The memory macro 400 further includes a sense amplifier 410, which is comprised of irregular electronic components, at the edge of the memory array 402. The irregular electronic components can be operable or inoperable as discussed above. As such, the memory device made based on the layout diagram can better sustain the process variations or improve its performance.

A exemplary relation between a memory array with edge memory cells and a read margin improvement for a 256 K-bit memory device using 4 columns of edge cells is presented as follows:

TABLE 1

| | Edge cell type | | |
|---|---|---|---|
| | A | B | C |
| Edge cell area | 100 | 109 | 118 |
| Read margin improvement | 100 | 106.436 | 114.78 |
| Total area comparison | 100 | 100.07 | 100.13 |

FIG. 5 graphically illustrates an exemplary relation between the sense amplifier size and the sensing margin. As the size of the sense amplifier increases, the mismatch becomes smaller, which leads to a better sensing margin as illustrated in the graph.

Figure 6:
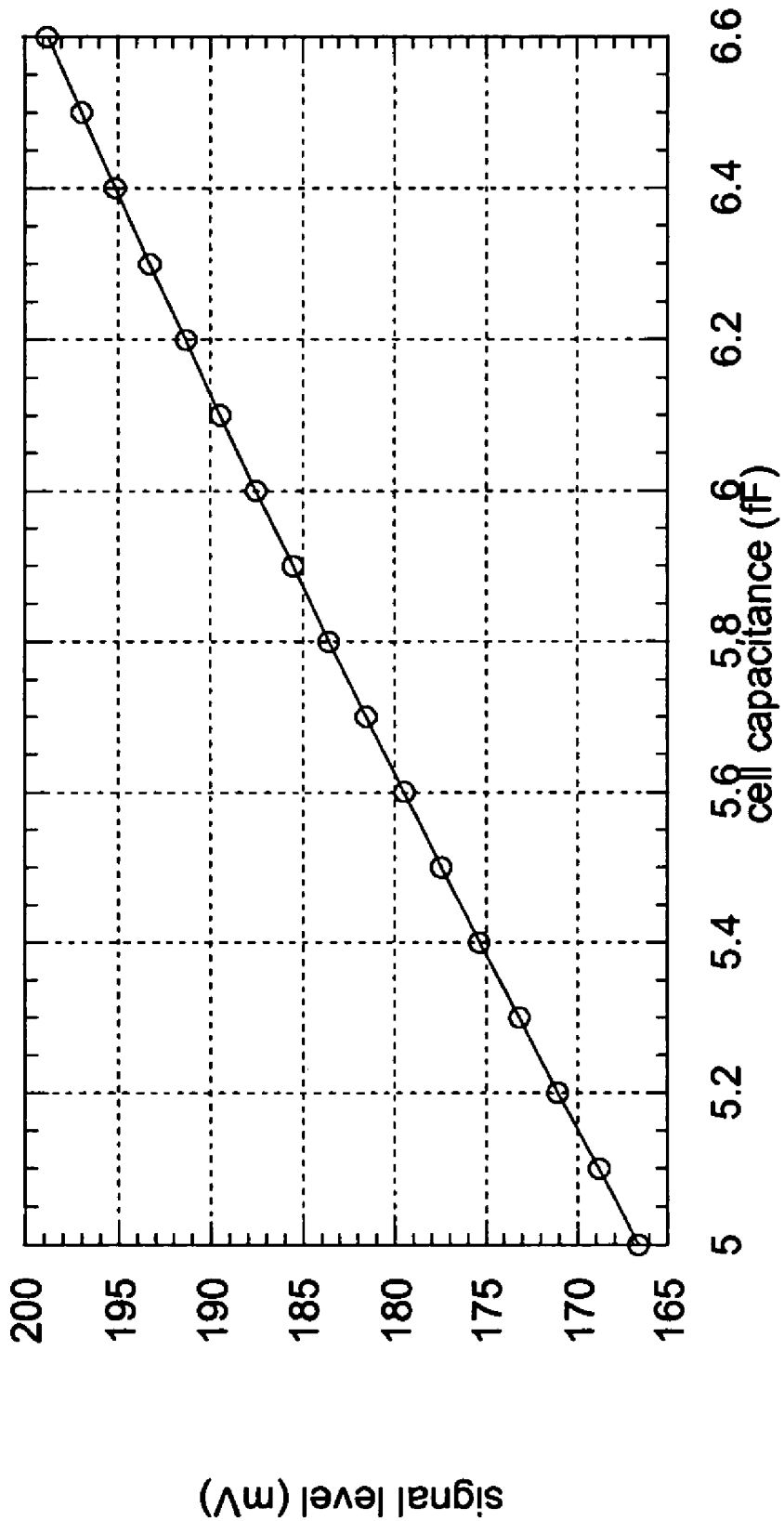
FIG. 6 graphically illustrates the relation between the cell capacitance and the sensing margin.

FIG. 6 graphically illustrates the relation between the cell capacitance and the sensing margin. As the cell size increases, the cell capacitance increases and results in a better sensing margin as illustrated in the graph.

Manufacturing using the various technology nodes results in different dimensions for the edge cells. The variation of the gate length and gate width between the inner memory cells and edge memory cells after manufacturing in the various technology nodes are estimated and presented in the following table. The estimation is done for the 250 nm, 180 nm, 130 nm, 90 nm and 65 nm technologies. In the table, the critical dimension variation is the difference in the final channel length or width at the edge of the array to the final channel length or width at the center of the array divided by the channel length or width as drawn on the mask. Based on the results, the channel length or width compensation is suggested for the edge cells for the various technology nodes.

TABLE 2

| Tech. Node | 250 nm | 180 nm | 130 nm | 90 nm | 65 nm |
|---|---|---|---|---|---|
| Typical exposure wavelength | 356 nm | 248 nm | 193 nm | 193 nm | 193 nm |
| CD variation | ~4% (10/250) | ~3% (5/180) | ~4% (5/130) | ~8% (8/100) | ~15% (12/80) |
| Row dimension compensation | Not needed | Not needed | Not needed | >~5% 5%–30% | >~5% 15%–60% |
| Column dimension compensation | Not needed | Not needed | Not needed | >~5% 5%–30% | >~5% 15%–60% |
| Area dimension compensation | Not needed | Not needed | Not needed | 10%–60% | 30%–130% |

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for generating a circuit layout for a memory macro having at least one memory array to be used to fabricate a memory device, the memory array including a plurality of memory cells and sense amplifiers, comprising:

generating a first set of memory cells and sense amplifiers comprised of regular electronic components disposed in a first area of the memory array, wherein the first area is disposed at an inner area of the memory array; and generating a second set of memory cells and sense amplifiers comprised of irregular electronic components disposed in a second area located along an edge of the memory array, the second set of memory cells and sense amplifiers comprised of irregular electronic components having different physical dimensions from those of the first set of memory cells and sense amplifiers comprised of regular electronic components to compensate for process-induced dimensional variations of the second set of memory cells and sense amplifiers, and wherein a memory compiler is used for generating the first and second sets of memory cells and sense amplifiers comprised of a predetermined number of transistors of the of the circuit layout, and wherein a channel length or width of a transistor in the second set of cells is longer than that of a transistor in the first set of cells so as to improve the operation speed of the memory device.

2. The method of claim 1, wherein a channel length or width of the transistor in the second set of cells is longer than that of the transistor in the first set of cells by at least 5%.

3. The method of claim 1, wherein a channel length or width of the transistor in the second set of cells is longer than that of the transistor in the first set of cells by a range from about 5% to about 30%.

4. The method of claim 1, wherein the second set of cells are inoperative.

5. The method of claim 1, wherein the second set of cells are operative.

6. The method of claim 1, wherein the second set of cells omit at least one critical layer that is necessary for the second set of cells to be operative.

7. The method of claim 1, wherein the second set of cells omit at least one critical electronic component that is necessary for the second set of cells to be operative.

8. A memory macro having at least one memory array to be used to fabricate a memory device, comprising:
   a first set of memory cells and sense amplifiers comprised of regular electronic components disposed in a first area located in an inner area of a memory array;
   a second set of memory cells and sense amplifiers comprised of irregular electronic components disposed in a second area located along an edge of the memory array, the second set of memory cells and sense amplifiers comprised of irregular electronic components having different physical dimensions from those of the first set of memory cells and sense amplifiers comprised of regular electronic components to compensate for process-induced dimensional variations of the second set of memory cells, wherein each memory cell includes a predetermined number of transistors; and
   a set of row decoders and column decoders configured to select a memory cell from the first and second sets of memory cells for a read or write operation of the memory macro, and
   wherein a channel length or width of a transistor in the second set of cells is longer than that of a transistor in the first set of cells so as to improve the operation speed of the memory device.

9. The memory macro of claim 8, wherein a channel length or width of the transistor in the second set of cells is longer than that of the transistor in the first set of cells by at least 5%.

10. The memory macro of claim 8, wherein a channel length or width of the transistor in the second set of cells is longer than that of the transistor in the first set of cells by a range from about 5% to about 30%.

11. The memory macro of claim 8 is a static random access memory (SRAM), dynamic random access memory (DRAM), non-volatile memory, or magnetoresistive random access memory (MRAM).

12. The memory macro of claim 8, wherein the second set of cells operate under one or more conditions independent from those for the first set of cells.

13. The memory macro of claim 8, wherein the second set of cells are operative.

14. The memory macro of claim 8, wherein the second set of cells are constructed incompletely as opposed to the first set of cells.

15. A memory macro having at least one memory array to be used to fabricate a memory device, comprising:
   a first set of memory cells comprised of regular electronic components disposed in a first area located in an inner area of a memory array;
   a second set of memory cells comprised of irregular electronic components disposed in a second area located along an edge of the memory array, the second set of memory cells having different physical dimensions from those of the first set of memory cells to compensate for process-induced dimensional variations of the second set of memory cells, wherein the memory array includes the first and second areas, wherein each memory cell includes a predetermined number of transistors;
   a first sense amplifier disposed adjacent to one side of the memory array away from the edge of the memory array;
   a set of row decoders and column decoders configured to select a memory cell from the first and second sets of memory cells for a read or write operation of the memory macro, and wherein the memory array includes at least the first and second sets of memory cells, and
   wherein a channel length or width of a transistor in the second set of cells is longer than that of a transistor in the first set of cells so as to improve the operation speed of the memory device.

16. The memory macro of claim 15 is a dynamic random access memory (DRAM).

17. The memory macro of claim 15, wherein the second set of cells operates under one or more conditions independent from those for the first sense amplifier.

18. The memory macro of claim 15, wherein a channel length or width of a transistor in the second set of cells is longer than that of a transistor in the first sense amplifier by at least 5%.

19. The memory macro of claim 15, wherein a channel length or width of a transistor in the second set of cells is longer than that of a transistor in the first set of cells by a range from about 5% to about 30%.

20. The memory macro of claim 15, wherein the second set of cells are inoperative.

* * * * *